United States Patent
Shimoe et al.

(10) Patent No.: US 6,617,194 B2
(45) Date of Patent: Sep. 9, 2003

(54) ELECTRONIC COMPONENT, COMMUNICATION DEVICE, AND MANUFACTURING METHOD FOR ELECTRONIC COMPONENT

(75) Inventors: Kazunobu Shimoe, Kanazawa (JP); Ryoichi Kita, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/207,195

(22) Filed: Jul. 30, 2002

(65) Prior Publication Data

US 2002/0180033 A1 Dec. 5, 2002

Related U.S. Application Data

(62) Division of application No. 09/696,708, filed on Oct. 25, 2000, now Pat. No. 6,459,149.

(30) Foreign Application Priority Data

Oct. 29, 1999 (JP) .......................................... 11-308659

(51) Int. Cl.[7] .............................................. H01L 21/44
(52) U.S. Cl. ........................ 438/106; 438/118; 438/119
(58) Field of Search ................................ 438/106, 112, 438/118, 119

(56) References Cited

U.S. PATENT DOCUMENTS

| | | | | |
|---|---|---|---|---|
| 5,523,622 A | * | 6/1996 | Harada et al. | 257/743 |
| 6,100,108 A | * | 8/2000 | Mizuno et al. | 438/51 |
| 6,165,820 A | * | 12/2000 | Pace | 438/125 |
| 6,249,049 B1 | * | 6/2001 | Kamada et al. | 257/703 |

* cited by examiner

Primary Examiner—David Nelms
Assistant Examiner—Thao Le
(74) Attorney, Agent, or Firm—Keating & Bennett, LLP

(57) ABSTRACT

An electronic component includes an electronic component element and a package to house the electronic component element. The package includes a concave area in which the electronic component element is housed, an area for a sealing frame which is located along the periphery of the concave area, and a sealing cover which is mounted on the area for a sealing frame so as to cover the concave area. Connecting electrodes are electrically connected to the electronic component element and a conductive pattern to be used for image recognition is provided on the upper surface of the area for a sealing frame.

7 Claims, 4 Drawing Sheets

ELECTRONIC COMPONENT, COMMUNICATION DEVICE, AND MANUFACTURING METHOD FOR ELECTRONIC COMPONENT

This application is a divisional of U.S. patent application No. 09/696,708 filed Oct. 25, 2000, now U.S. Pat. No. 6,459,149.

BACKGROUND OF THE INVENTION

1. Field of the Invention

The present invention relates to an electronic component and a manufacturing method therefor and more particularly, to an electronic apparatus having a structure configured to house an electronic component element easily and precisely inside a package and a manufacturing method therefor.

2. Description of the Related Art

Conventional electronic component elements, such as a surface acoustic wave element, is housed in a package and is used as an electronic component. A package for face-down mounting, in which the electronic component element is housed, is well known. In such face-down mounting, the two methods described below are used as a positioning method when electronic component elements are housed in such packages.

In a first method, a side wall of a concave portion of a package is used as a positioning guide, and an electronic component element is housed inside the package and is mounted face-down. In such a method, because an electronic component element is positioned after the electronic component element has been placed against the side wall of a concave portion of a package, which functions as a positioning guide, and the position of the side wall has been recognized and then the electronic component element is face-down mounted, the mounting can be easily carried out using a simple method.

In a second method, an electronic component element is face-down mounted using image recognition of an electrode pattern and a positional recognition mark located on the bottom surface of the electronic component element. That is, using the face-down mounting surface inside a concave portion of a package, the electronic component element is located and mounted in position. In such a method, because an electronic component element can be mounted at a position corresponding to the electrode pattern which is precisely located inside a concave portion of a package, very high positioning accuracy can be achieved.

However, in the first method, since the side wall of a concave portion of a package is used as a positioning guide, an electronic component element must be placed against the side wall at least once, and when such a process is taken into consideration, it was required that the area of the concave portion of the package must be larger than the electronic component element. Furthermore, although an electronic component element can be face-down mounted in a relatively simple method, the mounting can not be precisely performed.

Furthermore, in the second method, when image recognition of the electrode pattern and a positioning mark on the bottom surface in a concave portion of a package is performed, if a laminate of a plurality of ceramics and electrode patterns, that is, a ceramic package, for example, is used, the ceramic layers and electrode patterns are displaced from each other in the laminate, and then the electrode pattern and the positioning mark on the bottom surface in the concave portion of a package to be used for image recognition and the side wall of the package are displaced from each other by about 0.1 mm in the worst case. As a result, in order that an electronic component element is arranged to not contact the side wall so as to avoid damage of the electronic component element when the element is mounted face-down, the size of the electronic component element which is equal to 0.2 mm, which is twice as much as the above-described displacement, must be reduced. Furthermore, when a positioning mark is formed on the bottom surface of a concave portion of a package, an additional area for forming a positioning mark is required and accordingly, the package size must be increased greatly.

SUMMARY OF THE INVENTION

In order to overcome the problems described above, preferred embodiments of the present invention provide an electronic component having a construction with which the mounting position of the electronic component element can be determined with very high precision inside a package. As a result, a much larger electronic component element can be mounted face-down, and manufacturing efficiency and productivity are greatly improved.

The electronic component according to one preferred embodiment of the present invention includes an electronic component element and a package arranged to house the electronic component element, the package including a concave area in which the electronic component element is to be housed, an area for a sealing frame to be disposed along the periphery of the concave area, and a sealing cover to be mounted on the area for a sealing frame, wherein connecting electrodes to which the electronic component element is electrically connected are located in the concave area, and in that a conductive pattern to be used for image recognition is disposed on the upper surface of the area for a sealing frame.

Thus, as a conductive pattern to be used for image recognition is located on the upper surface of an area for a sealing frame, a concave area can be distinguished by performing image recognition of the conductive pattern, and therefore, it is very easy and effective to accurately and precisely mount and house an electronic component element.

An electronic component according to another preferred embodiment of the present invention includes a conductive pattern disposed on the entire upper surface of the area for a sealing frame. Since the conductive pattern is disposed on the entire upper surface of the area for the sealing frame, even if packages become small-sized with miniaturization of electronic components, a concave area can be easily distinguished.

An electronic component according to another preferred embodiment of the present invention is arranged such that the conductive pattern extends to the internal surface of the area for a sealing frame. Since a conductive pattern extends to the internal surface of the area for the sealing frame, even if the printing of the conductive pattern is displaced when the conductive pattern is printed in the area for the sealing frame, the internal end surface of the area for the sealing frame is covered by the conductive pattern and accordingly, the concave area can be always distinguished.

In a communication device according to a preferred embodiment of the present invention, the above-described electronic component is included.

A method of manufacturing an electronic component according to another preferred embodiment of the present invention includes providing an electronic component element and a package to house the electronic component element, forming a conductive pattern for sealing on the upper surface of an area for a sealing frame constituting the package by printing using a printing mask having an opening portion which is larger than the upper surface of the area for a sealing frame. Since a conductive pattern is printed on the upper surface of the area for the sealing frame using a printing mask having an opening larger than the upper surface of the area for the sealing frame, the conductive pattern can be formed so as to extend to the internal surface of the area for the sealing frame.

A method of manufacturing an electronic component according to another preferred embodiment of the present invention includes providing an electronic component element and a package to house the electronic component element, includes the step of performing image recognition of an area for a sealing frame constituting the package so that the electronic component element is housed inside the package. Since image recognition is performed on an area for a sealing frame, an electronic component element is easily housed and mounted by distinguishing and identifying a concave area.

A method of manufacturing electronic components according to a preferred embodiment of the present invention includes the step of performing image recognition of a conductive pattern for sealing formed in the area for a sealing frame. As a result of image recognition of a conductive pattern disposed on the upper surface of an area for a sealing frame being performed, an electronic component element can be easily housed and mounted by distinguishing a concave area.

A method of manufacturing an electronic component according to another preferred embodiment of the present invention includes a step of recognizing an insulating pattern located in the area for a sealing frame so as to perform image recognition. By image recognition of an insulating pattern located on the upper surface of an area for a sealing frame being performed, an electronic component element can be easily housed and mounted by distinguishing a concave area.

A method of manufacturing an electronic component according to a further preferred embodiment of the present invention includes the step of recognizing a base material of a package exposed in the area for a sealing frame in order to perform image recognition. As a result of image recognition of a base material of a package exposed in an area for a sealing frame being performed, an electronic component element can be easily housed and mounted by distinguishing a concave area.

As described above, according to an electronic component and a manufacturing method thereof of various preferred embodiments of the present invention, the size and location of a concave area of a container can be accurately determined and the precision of installation of an electronic component element into a container is greatly improved. Because of this, a larger electronic component element can be installed, and at the same time, efficiency of manufacture and production of electronic components are greatly improved.

Furthermore, with microminiature electronic components having dimensions of less than about 3.0 mm × about 3.0 mm, the displacement of conductive patterns is not negligible even if it is compared with other factors such as mounting accuracy of face-down mounting machines, etc., and accordingly, an electronic component and a manufacturing method therefor of various preferred embodiments of the present invention are very appropriate.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
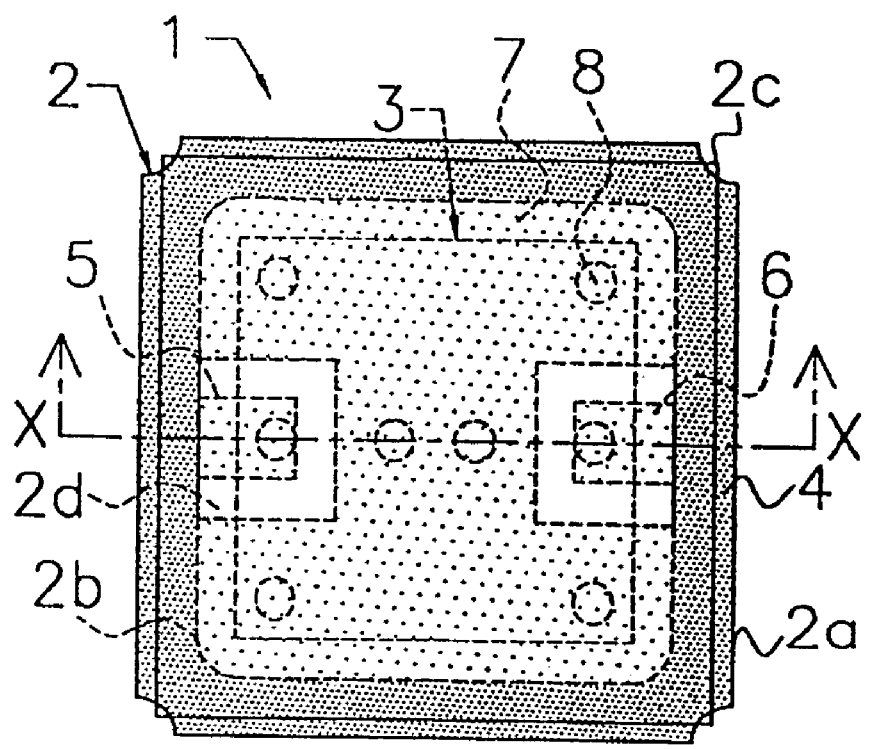
FIG. 1 is a top view of a surface acoustic wave device according to a first preferred embodiment of the present invention.
Figure 2:
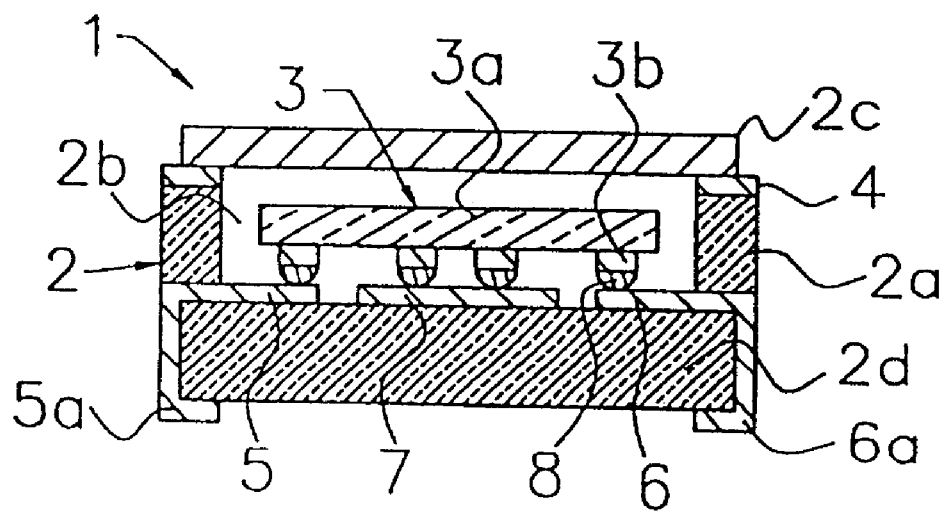
FIG. 2 is a sectional view taken along line X—X of FIG. 1.
Figure 3:
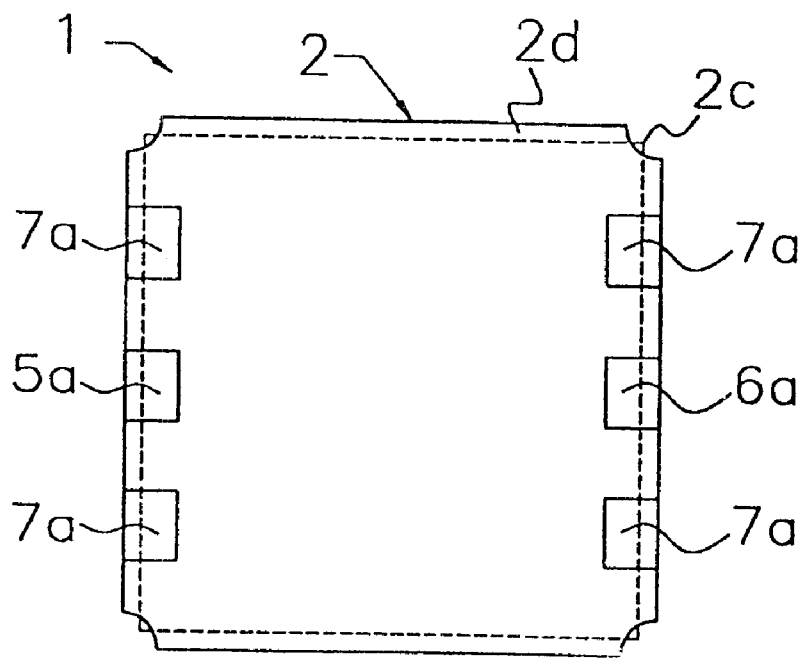
FIG. 3 is the bottom view of the surface acoustic wave device in FIG. 1.

A preferred embodiment of the present invention is described with FIGS. 1 to 3. FIG. 1 shows a top view of a surface acoustic wave device illustrating an electronic component according to a preferred embodiment of the present invention, FIG. 2 is a sectional view taken along line X—X in FIG. 1, and FIG. 3 is the bottom view of the device shown in FIG. 1, that is, the bottom view showing the mounting surface of a surface acoustic wave device 1.

As shown in FIG. 1, the surface acoustic wave device 1 preferably includes a package 2 and a surface acoustic wave element 3 to be housed in the package 2.

In the package 2, a concave area 2b is defined by an area 2a for a sealing frame and a package substrate 2d, and a cover 2c is attached on the area 2a for a sealing frame. A conductive pattern 4 is disposed on the entire upper surface of the area 2a for a sealing frame, and by joining the cover 2c to the conductive pattern by solder, or other suitable joining material, the concave area 2b is hermetically sealed.

Furthermore, input/output electrodes 5 and 6 and a grounding electrode are disposed on the upper surface of the package substrate 2d, and external input/output electrodes 5a and 6a and an external electrode 7a which extend to the lower surface of the package substrate 2d through the side surface thereof are provided.

In the surface acoustic wave device 3, a comb-like electrode, which is not illustrated, and an electrode pad 3b are provided on the surface of a piezoelectric substrate 3a. The piezoelectric substrate 3a having the comb-like electrode and the electrode pad 3b disposed thereon, is mounted face-down through bumps 8 in the package 2.

In such a surface acoustic wave device 1, when a surface acoustic wave element 3 is mounted face-down, by picture recognition of the conductive pattern 4, the differentiation between the area 2a for a sealing frame and the concave area 2b is detected and the surface acoustic element 3 is disposed in the concave area 2b. The conductor pattern 4 preferably includes a tungsten layer, a nickel layer and a gold layer in this order. The nickel layer and the gold layer are plated on the tungsten layer. As the gold layer has a bright surface, the image recognition is made possible by contrasting the pattern with other adjacent areas.

As described above, because image recognition of the conductive pattern 4 to be used for sealing is easily performed with this unique construction, face-down mounting becomes easy by distinguishing between the area 2a for a sealing frame and the concave area 2b.

Figure 4:
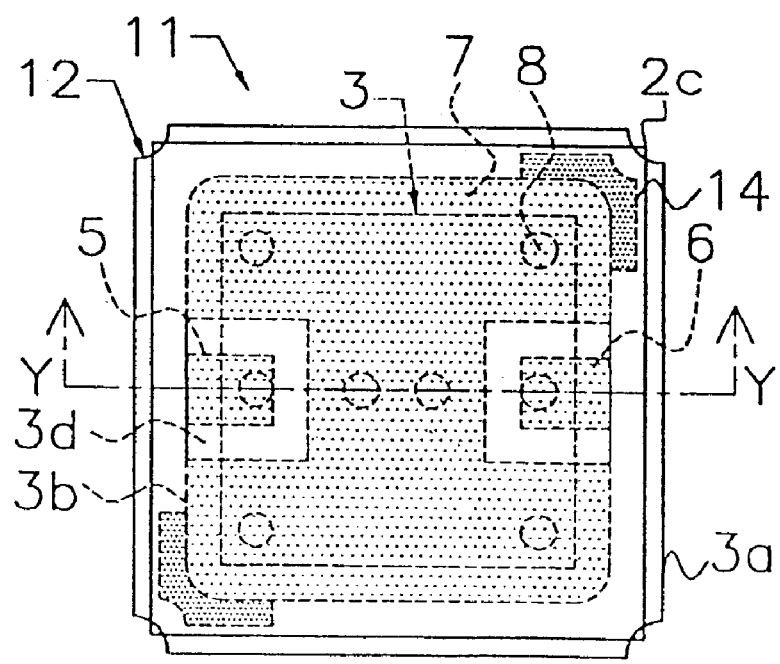
FIG. 4 is a top view of a surface acoustic wave device according to a second preferred embodiment of the present invention.
Figure 5:
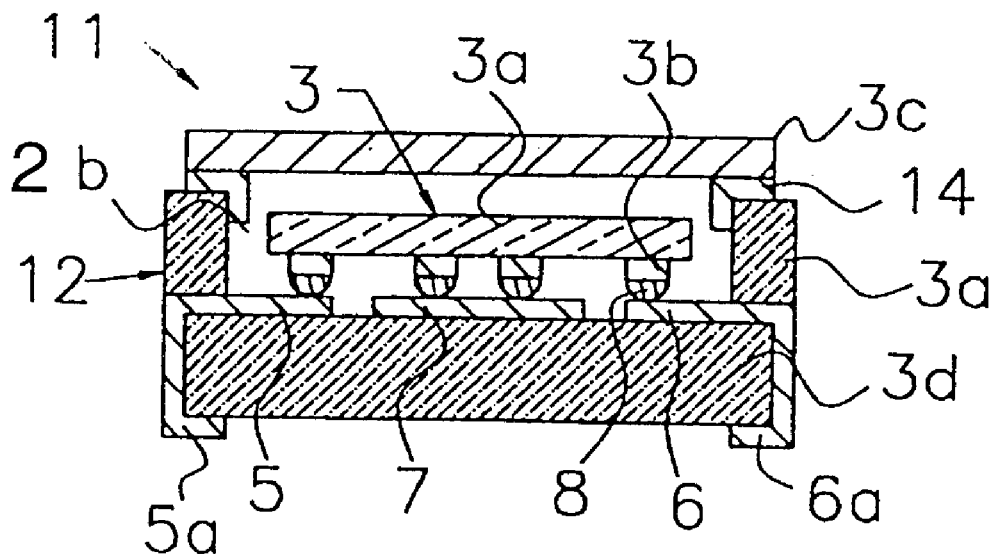
FIG. 5 is a sectional view taken along line Y—Y of FIG. 4.

Next, an electronic component according to a second preferred embodiment of the present invention is described by taking a surface acoustic wave device as an example, with reference to FIGS. 4 and 5. FIG. 4 is a top view of a surface acoustic wave device 11 according to a second preferred embodiment of the present invention, and FIG. 5 is a sectional view taken along line Y—Y in FIG. 4. Furthermore, like elements are denoted by reference numerals that are the same as those used in describing the first preferred embodiment and thus, repetitive description thereof is omitted.

As shown in FIG. 4, what is different from the first preferred embodiment is the shape of a conductive pattern 14 on the upper surface of an area 2a for a sealing frame of a package 12. As shown in FIG. 4, conductive patterns 14 are disposed in the two corner portions located on a diagonal line of the area 2a for a sealing frame in FIG. 4. Because of these two corner portions, the boundary between the area 2a for a sealing frame and the concave area 2b is easily distinguished.

Furthermore, as shown in FIG. 5, the conductive patterns 14 are arranged to extend to the internal surface of the area 2a of a sealing frame. When such conductive patterns are provided, by extending an opening of a mask corresponding to the printing pattern slightly over the concave area, the conductive patterns 14 shown in FIG. 5 are obtained unless the printing is performed out of place.

When constructed in this way, even if the printing of the conductive patterns 14 is displaced in the upper or lower direction or in the left or right direction, as the internal end surface of the area 2a for a sealing frame is covered by the conductive pattern 14 without fail, the size and shape of the concave area 2a can be easily distinguished.

Furthermore, in the present preferred embodiment, although the conductive patterns 14 were arranged to extend to the internal surface of the area 2a for a sealing frame at the two corner portions, located along a diagonal line, of the area 2a for a sealing frame, the pattern is not limited to this configuration. The conductive pattern 14 may be disposed at the four corner portions or the conductive pattern may be arranged so as to cover the entire upper surface of the area 2a for a sealing frame and to extend to the internal surface of the area 2a for a sealing frame as in the first preferred embodiment.

Figure 6:
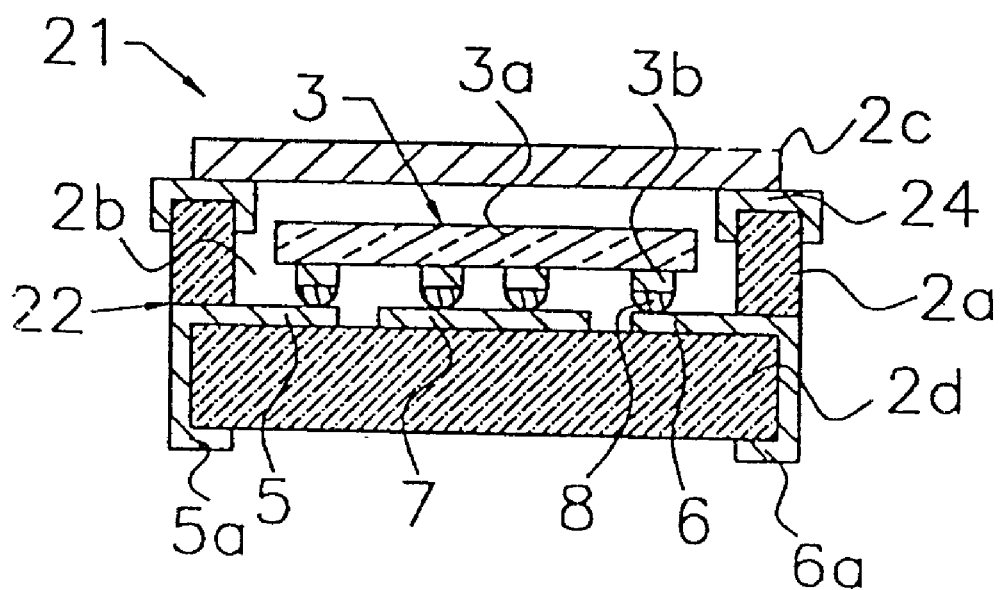
FIG. 6 is a top view of a surface acoustic wave device according to a third preferred embodiment of the present invention.

Next, an electronic component according to a third preferred embodiment of the present invention is described by taking a surface acoustic wave device as an example, with reference to FIG. 6. FIG. 6 is a sectional view of a surface acoustic wave device 21 at the same location as in FIG. 2 of the first preferred embodiment. Furthermore, like elements are denoted by reference numerals that are the same used in the description of the first preferred embodiment and second preferred embodiment and thus, repetitive description thereof is omitted herein.

As shown in FIG. 6, what is different from the first and second preferred embodiments is the shape of a conductive pattern 24 on the upper surface of an area 2a for a sealing frame of a package 22. As shown in FIG. 6, the conductive pattern 24 is arranged to extend to the internal surface and the external surface of the area 2a for a sealing frame. When such a conductive pattern is provided, by making the area of an opening of a mask corresponding to the printing pattern slightly larger than the upper surface of the area 2a for a sealing frame, a conductive pattern 14 shown in FIG. 6 is obtained unless the printing is performed out of place.

When constructed in this way, even if the printing of the conductive pattern 24 is displaced when the conductive pattern is printed, as the internal end surface and upper surface of the area 2a for a sealing frame is covered by the conductive pattern 24 without fail, the size and shape of the concave area 2a can be easily distinguished. Since the printing accuracy of the conductive pattern is in the range of about ±0.1 mm, when the conductive pattern 24 is printed on the upper surface of the area 2a for a sealing frame, it is desirable to make the opening portion of the printing mask at least about 0.15 mm larger than the internal periphery of the area for a sealing frame.

Furthermore, the conductive pattern 24 of the present preferred embodiment may be arranged in such a way that the pattern 24 is disposed in the two corner portions located on a diagonal line of the area 2a for a sealing frame as shown in FIG. 4.

Figure 7:
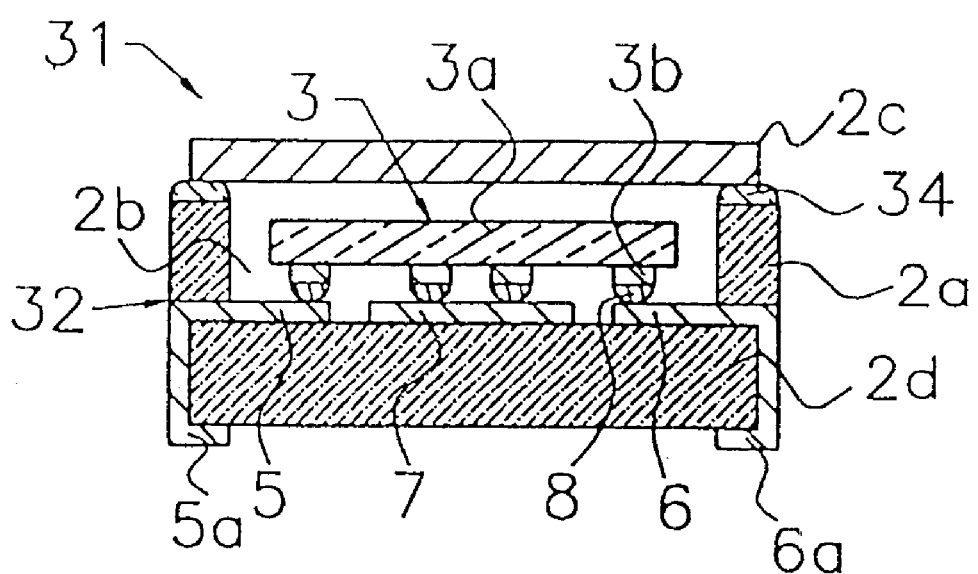
FIG. 7 is a top view of a surface acoustic wave device according to a fourth preferred embodiment of the present invention.

Next, an electronic component according to a fourth preferred embodiment of the present invention is described by taking a surface acoustic wave device as an example, with reference to FIG. 7. FIG. 7 is a sectional view of a surface acoustic wave device 31 at the same location as in FIG. 6 of the third preferred embodiment. Furthermore, like elements are denoted by reference numerals which are the same as those used in the description of the first, second and third preferred embodiments and description is omitted.

As shown in FIG. 7, what is different from the first through third preferred embodiments is that, instead of a conductive pattern, an insulating pattern 34 is disposed on the upper surface of an area 2a for a sealing frame of a package.

When constructed in this way, because the insulating pattern 34 is clearly contrasted with input/output electrodes 5 and 6 and a grounding electrode 7 on the bottom surface of a concave area 2b, image recognition is made easier. Furthermore, when epoxy resin, or other suitable materials, are used for the insulating pattern 34, they can be utilized for resin sealing of a cover 2c. Furthermore, not only resin, but also alumina coating can be utilized in the same manner.

Furthermore, the insulating pattern 34 of the present preferred embodiment of the present invention may be formed so as to extend to the internal surface and the external surface of the area 2a for a sealing frame using the methods as in the second preferred embodiment and third preferred embodiment.

Figure 8:
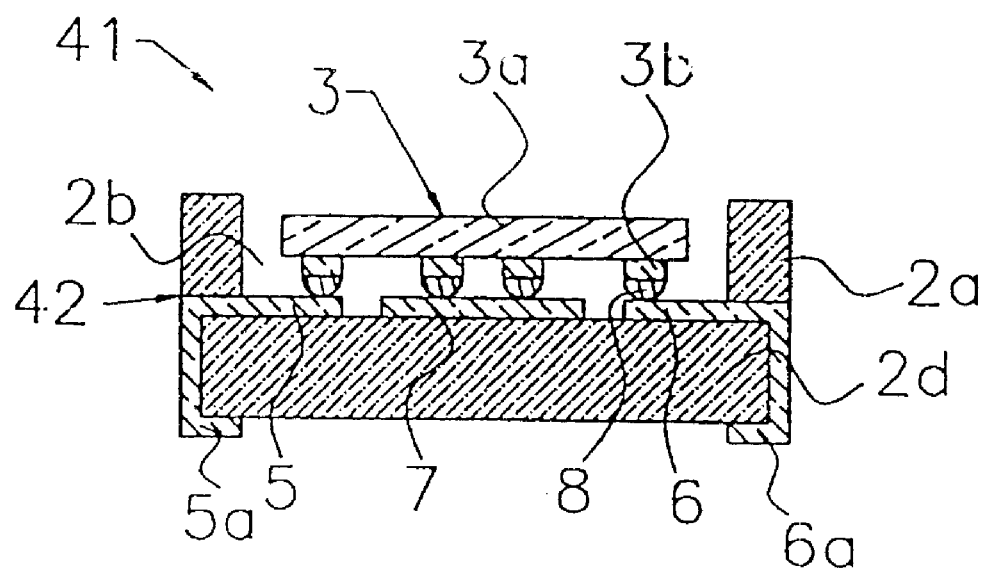
FIG. 8 is a top view of a surface acoustic wave device according to a fifth preferred embodiment of the present invention.

Next, a manufacturing method for an electronic component according to a fifth preferred embodiment of the present invention is described by taking a surface acoustic wave device as an example with reference to FIG. 8. FIG. 8 is a sectional view of a surface acoustic wave device 41 at the same location as in FIG. 7 of the fourth preferred embodiment. Furthermore, like elements are denoted by reference numerals which are the same as those used in the description of the first through fourth preferred embodiments and thus, repetitive description thereof is omitted.

As shown in FIG. 8, what is different from the first through fourth preferred embodiments is that, in the first through fourth preferred embodiments, after a conductive pattern or an insulating pattern has been disposed on a portion of or the entire area of the upper surface of the area 2a for a sealing frame, a conductive pattern and an insulating pattern were used for image recognition, but that, in the present preferred embodiment, before anything is formed on the upper surface of the area 2a for a sealing frame of the package 42, a surface acoustic wave element is mounted face-down.

In this case, because nothing is formed on the upper surface of the area 2a for a sealing frame of a package 42, a base material of the package 62 is exposed. A ceramic material, for example, is used as a base material of the package 42 and the ceramic material is black or close to black. Accordingly, because the area 2a for a sealing frame is clearly contrasted with input/output electrodes 5 and 6 and a grounding electrode 7 on the bottom surface of a concave area 2b, image recognition is made easier.

Furthermore, in the present preferred embodiment, after a surface acoustic wave element 3 has been mounted face-down, a sealing material such as a conductive pattern, an insulating pattern, or other suitable material or element, is provided on the upper surface of the area 2a for a sealing frame to join a cover 2c.

An electronic component produced by any of the manufacturing methods described above, a filter, for example, may be used in communication devices.

While preferred embodiments of the present invention have been disclosed, various modes of carrying out the principles disclosed herein are contemplated as being within the scope of the following claims. Therefore, it is understood that the scope of the present invention is not limited except as otherwise set forth in the claims.

What is claimed is:

1. A method of manufacturing an electronic component apparatus, comprising the steps of:

providing an electronic component element;

providing a package arranged to house the electronic component element and including an area for a sealing frame;

forming one of a conducive pattern and an insulating pattern on an upper surface of the area for the frame by printing using for the sealing frame; and arranging said one of a conductive pattern and an isolating pattern such that said of a conductive pattern and an insulating pattern is used fir mage recognition.

2. A method of manufacturing an electronic component apparatus, comprising the steps of:

providing an electronic component element;

providing a package arranged to house the electronic component element and including an area for a sealing frame;

arranging said one of a conductive pattern and an insulating pattern such that said one of a conductive pattern and an insulating pattern is used for image recognition; and mounting the electronic component element in the housing including the step of performing image recognition of at least one of he area for the sealing frame and one of the conductive pattern and the insulating pattern.

3. The method according to claim 2, wherein the package includes a base, and the step of mounting includes the step of performing image recognition of the base of the package.

4. The method according to claim 2, wherein the electronic component element is mounted face down in the concave area of the package.

5. The method according to claim 2, wherein the step of forming one of the conductive pattern and the insulating pattern on the upper surface of the area for the sealing frame includes the step of printing using a printing mask having an opening portion larger than the upper surface of the area for the sealing frame.

6. The method according to claim 2, wherein the step of performing image recognition includes detecting a difference between the area for the sealing frame and the concave area of the package.

7. The method according to claim 2, wherein before the step of forming the conductive pattern and the insulating pattern on the upper surface of the area for the sealing frame, the electronic component element is mounted face-down in the concave area of the package.

* * * * *